United States Patent
Zeine et al.

(10) Patent No.: US 12,255,410 B2
(45) Date of Patent: Mar. 18, 2025

(54) NON-VOLATILE, LOW POWER PHASE SHIFTER FOR TAPPED TRANSMISSION LINES

(71) Applicant: Ossia Inc., Redmond, WA (US)

(72) Inventors: Hatem Zeine, Woodinville, WA (US); Mark Zeid, Issaquah, WA (US); Ronald Rotstein, Newcastle, WA (US)

(73) Assignee: Ossia Inc., Redmond, WA (US)

( * ) Notice: Subject to any disclaimer, the term of this patent is extended or adjusted under 35 U.S.C. 154(b) by 365 days.

(21) Appl. No.: 17/736,488

(22) Filed: May 4, 2022

(65) Prior Publication Data
US 2022/0359984 A1 Nov. 10, 2022

Related U.S. Application Data

(60) Provisional application No. 63/184,213, filed on May 5, 2021.

(51) Int. Cl.
*H01Q 3/36* (2006.01)
*H01P 1/18* (2006.01)
*H01Q 21/00* (2006.01)

(52) U.S. Cl.
CPC ............ *H01Q 3/36* (2013.01); *H01P 1/184* (2013.01); *H01Q 21/0006* (2013.01)

(58) Field of Classification Search
CPC ...... H01Q 3/36; H01Q 21/0006; H01P 1/184; H01P 1/185; H03H 7/185; H03H 7/20; H03H 11/20

USPC ............................. 333/24 R, 139, 156, 161
See application file for complete search history.

(56) References Cited

U.S. PATENT DOCUMENTS

| | | |
|---|---|---|
| 8,593,219 B1 | 11/2013 | Root |
| 9,559,429 B2 * | 1/2017 | Fang ................. H01Q 3/32 |
| 2004/0179391 A1 | 9/2004 | Bhattacharyya |
| 2012/0039366 A1 | 2/2012 | Wood et al. |
| 2013/0135933 A1 | 5/2013 | Horch |
| 2019/0020088 A1 * | 1/2019 | Huettner ............ H03K 17/693 |

FOREIGN PATENT DOCUMENTS

KR 2011-0003960 A 1/2011

OTHER PUBLICATIONS

International Application No. PCT/US2022/027623, International Search Report, Written Opinion, 13 pages, Aug. 10, 2022.

* cited by examiner

*Primary Examiner* — Jorge L Salazar, Jr.

(57) ABSTRACT

Apparatus, system and method for operating a transmission line. The transmission line includes two non-electrically coupled conductive sections. At least one electronic device is coupled to and between the two sections of the transmission line. The at least one electronic device are configured to stably maintain, in the absence of electric current applied to the at least one electronic device, a conductive state, and a non-conductive state, as between the two sections of the transmission line.

20 Claims, 10 Drawing Sheets

PHASE SHIFTER USING PROGRAMMABLE FLASH CELLS – PRESENT TECHNOLOGY

PHASE SHIFTER USING PROGRAMMABLE FLASH CELLS – PRESENT TECHNOLOGY

NON-VOLATILE, LOW POWER PHASE SHIFTER FOR TAPPED TRANSMISSION LINES

CROSS-REFERENCE TO RELATED APPLICATIONS

This application claims priority to U.S. Provisional Patent Application No. 63/184,213 filed on May 5, 2021, which is incorporated herein by reference in its entirety. This application is also related to International Patent Application No. PCT/US2022/027623 filed on May 4, 2022, which is incorporated herein by reference in its entirety.

BACKGROUND

Tapped transmission lines enable phase shifting in antennas. The "taps" of known apparatuses, systems and methods of operation utilize electronic devices such as switches, positive-intrinsic-negative diode (PIN) diodes, and others that require actively applied current to maintain the tap in either a conducting or non-conducting state as between the sections of transmission line in order to maintain or change a given phase shift. As examples of known technology, a mixer-based phase shifter requires multiple active radio frequency (RF) multipliers, and a PIN diode switchable path length phase shifter requires active biasing for the PIN diodes.

In the known apparatuses, systems and methods, the aforementioned active current requires electric power for the wireless devices such tapped transmission lines are being used in, for, or with, including for phase shifting. Where such known tapped transmission lines are applied to antenna arrays, for example, the power consumption requirements scale with the number of antenna elements. As wireless systems progress towards the use of large array antennas, there is a need for accurate, low power and low-cost phase shifters to support very large numbers of antenna elements. Naturally, the power efficiency and thus also operational costs are inversely proportional to the number of such array elements employing known tapped transmission line phase shifting techniques.

Accordingly, a need exists for technology that overcomes the problem demonstrated above, as well as one that provides additional benefits. The examples provided herein of some prior or related systems and their associated limitations are intended to be illustrative and not exclusive. Other limitations of existing or prior systems will become apparent to those of skill in the art upon reading the following detailed description.

SUMMARY

The present technology provides apparatuses, systems and methods for operating a transmission line. The transmission line includes two non-electrically coupled conductive sections. At least one electronic device is coupled to and between the two sections of the transmission line. The at least one electronic device(s) may be configured to stably maintain, in the absence of electric current applied to the at least one electronic device, a conductive state, and a non-conductive state, as between the two sections of the transmission line.

A first aspect of the present technology provides an apparatus. The apparatus according to the present technology may be used for operating transmission line(s). The apparatus may include a transmission line including two non-electrically coupled sections. The apparatus may also include at least one electronic device coupled to and between the two sections. The at least one electronic device may stably maintain, in the absence of electric current applied thereto, a conductive state and a non-conductive state as between the two transmission line sections.

A second aspect of the present technology provides a system. The system according to the present technology may be used for operating transmission line(s). The system may include a transmission line including two non-electrically coupled sections. The apparatus may also include at least one electronic device coupled to and between the two sections. The at least one electronic device may stably maintain, in the absence of electric current applied thereto, a conductive state and a non-conductive state as between the two transmission line sections. The system may further include a controller operatively coupled to the at least one electronic device. The controller may transmit and/or withhold a control signal to or from the at least one electronic device to enable the conductive, and non-conductive, states to be stably maintained.

A third aspect of the present technology provides a method. The method according to the present technology may be used for operating transmission line(s) as, for example, the transmission line of the aforementioned first or second aspects. The method may include maintaining, in the absence of electric current applied to the at least one electronic device, a conductive state and a non-conductive state as between the two transmission line sections.

A fourth aspect of the present technology provides one or more non-transitory computer readable media. The one or more non-transitory computer readable media may be used for operating transmission line(s), as for example, the transmission line of the aforementioned first, second or third aspects. The one or more non-transitory computer readable media may have stored thereon program instructions (e.g., software or firmware) which, when executed by at least one processor, cause a machine to implement, at least in part, one or more steps of the method according to the third aspect.

A fifth aspect of the present technology provides one or more non-transitory computer readable media. The one or more non-transitory computer readable media may be used for operating transmission line(s), as for example, the transmission line of the aforementioned first, second or third aspects. The one or more non-transitory computer readable media may have stored thereon program instructions (e.g., software or firmware) which, when executed by at least one processor, cause a machine to cause a conductive state and a non-conductive state to be maintained as between the two transmission line sections.

BRIEF DESCRIPTION OF THE DRAWINGS

One or more embodiments of the present invention are illustrated by way of example and not limitation in the figures of the accompanying drawings, in which like references indicate similar elements.

DETAILED DESCRIPTION

The following description and drawings are illustrative and are not to be construed as limiting. Numerous specific details are described to provide a thorough understanding of the disclosure. However, in certain instances, well-known or conventional details are not described in order to avoid obscuring the description. References to one or an embodiment in the present disclosure can be, but not necessarily are, references to the same embodiment; and, such references mean at least one of the embodiments.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but no other embodiments.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that the same thing can be said in more than one way.

Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification, including examples of any terms discussed herein, is illustrative only, and is not intended to further limit the scope and meaning of the disclosure or of any exemplified term. Likewise, the disclosure is not limited to various embodiments given in this specification.

Without intent to further limit the scope of the disclosure, examples of instruments, apparatus, methods and their related results according to the embodiments of the present disclosure are given below. Note that titles or subtitles may be used in the examples for convenience of a reader, which in no way should limit the scope of the disclosure. Unless otherwise defined, all technical and scientific terms used herein have the same meaning as commonly understood by one of ordinary skill in the art to which this disclosure pertains. In the case of conflict, the present document, including definitions, will control.

This present disclosure describes systems, methods, and apparatuses for operating a transmission line. A transmission line may include two non-electrically coupled conductive sections. At least one electronic device is coupled to and between the two sections. The electronic device(s) is/are configured to stably maintain, in the absence of electric current applied to the at least one electronic device(s), a conductive state, and a non-conductive state, as between the two sections of the transmission line. A controller may be operatively coupled to the at least one electronic device. The controller transmits and/or withholds a control signal to and/or from the electronic device(s) to enable the conductive, and non-conductive, states to be stably maintained.

The present technology improves on known apparatuses, systems and methods by enabling passive phase shifting techniques requiring comparatively less power consumption. In both single antenna and antenna array applications, the phase shifting achieved by the present technology consumes less energy as compared to known techniques during the reception/transmission time of the antenna or array.

Known apparatuses, systems and methods use active switches, PIN diodes, and/or other devices that require active current to be applied to them even after times that they are switched to or from conducting to non-conducting states, or vice versa. In embodiments of the present technology, electronic devices that do not require application of current to them during non-switching times are utilized in tapped transmission lines, thereby reducing overall power consumption during operation. As a result, additional beneficial technical effects may be realized, including, without limitation, lowering generation of heat in consequence of the reduced power consumption, and also lower operating and/or maintenance costs for the apparatus as well as devices in which the disclosed apparatuses are used.

In some embodiments, the active devices (e.g., active switches and/or PIN diodes) used in phase shifters are replaced with a Flash read only memory (ROM) cell. A Flash Rom cell may be embodied in, or may include, a field effect transistor (FET) with a 'floating' gate. A digital control circuit can charge and discharge the floating gate with a sufficient 'static' charge in an amount sufficient to enable a state that when the floating gate is charged, the transistor is in the 'on' condition with very low impedance (conducting state, or short circuit). When the floating gate is discharged (e.g., charge removed therefrom), the transistor is in the 'off' condition exhibiting a very high impedance (open circuit, or non-conducting state). As a non-limiting example, the FET element is designed to exhibit very low leakage of the floating gate charge. As a result, once the FET is set to either 'Open' or 'Short', this state will be maintained over a period of time, without the need to maintain applied electric current, in contrast to an active switch or biasing a PIN diode.

Figure 1:
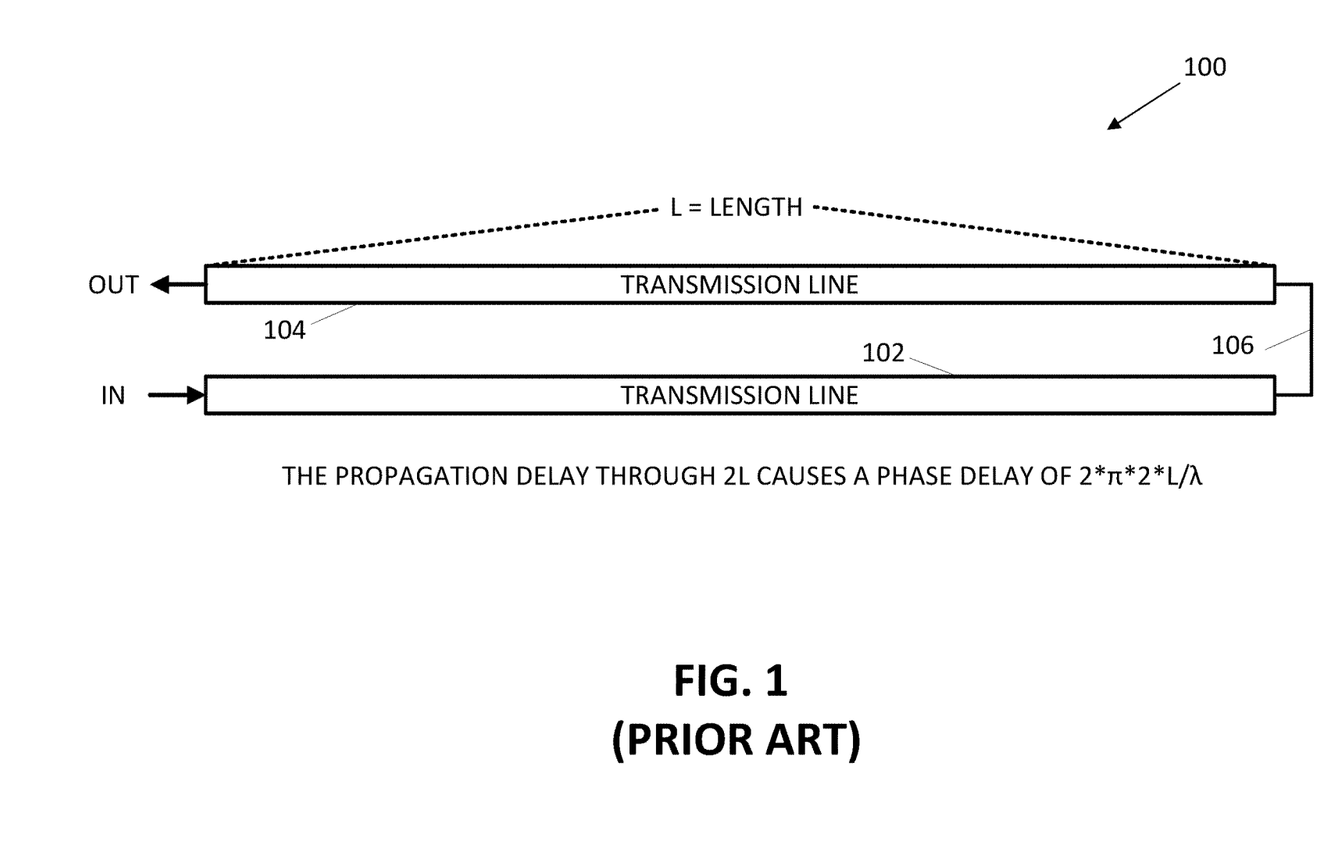
FIG. 1 depicts a schematic diagram of an example of an apparatus providing a transmission line according to a known embodiment.
Figure 2:
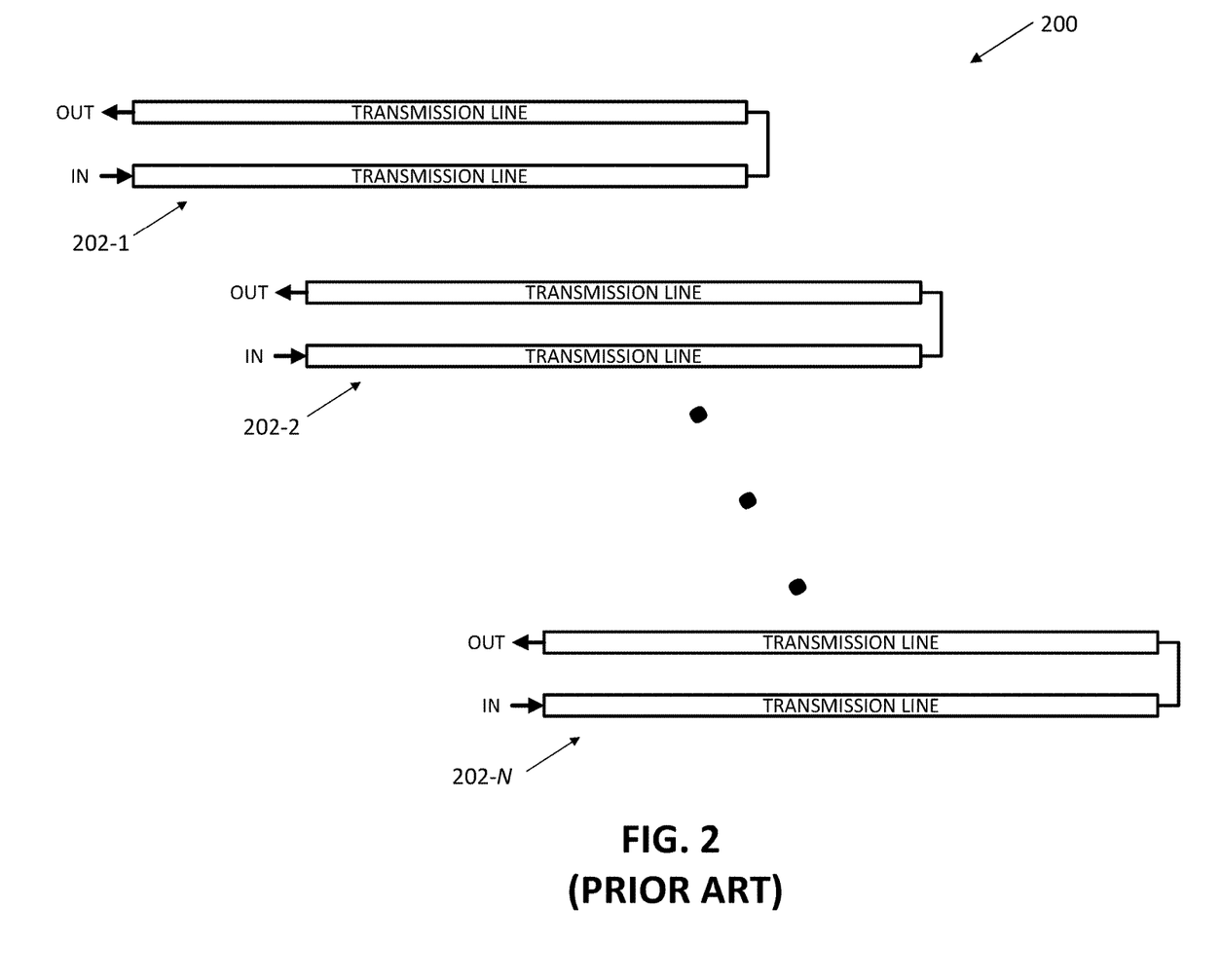
FIG. 2 depicts a schematic diagram of an example of multiple apparatuses including a plurality of transmission lines that can provide an antenna array according to a known embodiment.

FIG. 1 depicts a schematic diagram of an apparatus (100) providing a transmission line according to a known embodiment. A tapped transmission line includes two sections (102, 104), each having a first end (left side of FIG. 1) and a second end (right side of FIG. 1). The two sections (102, 104) are electrically coupled together by a conductor (106) proximate to their respective second ends, as shown in FIG. 1. FIG. 2 depicts a schematic diagram of an example of multiple apparatuses 300 including a plurality of transmission lines (e.g., 202-1, 202-2, . . . , 202-N) that can provide an antenna array according to a known embodiment.

Figure 3:
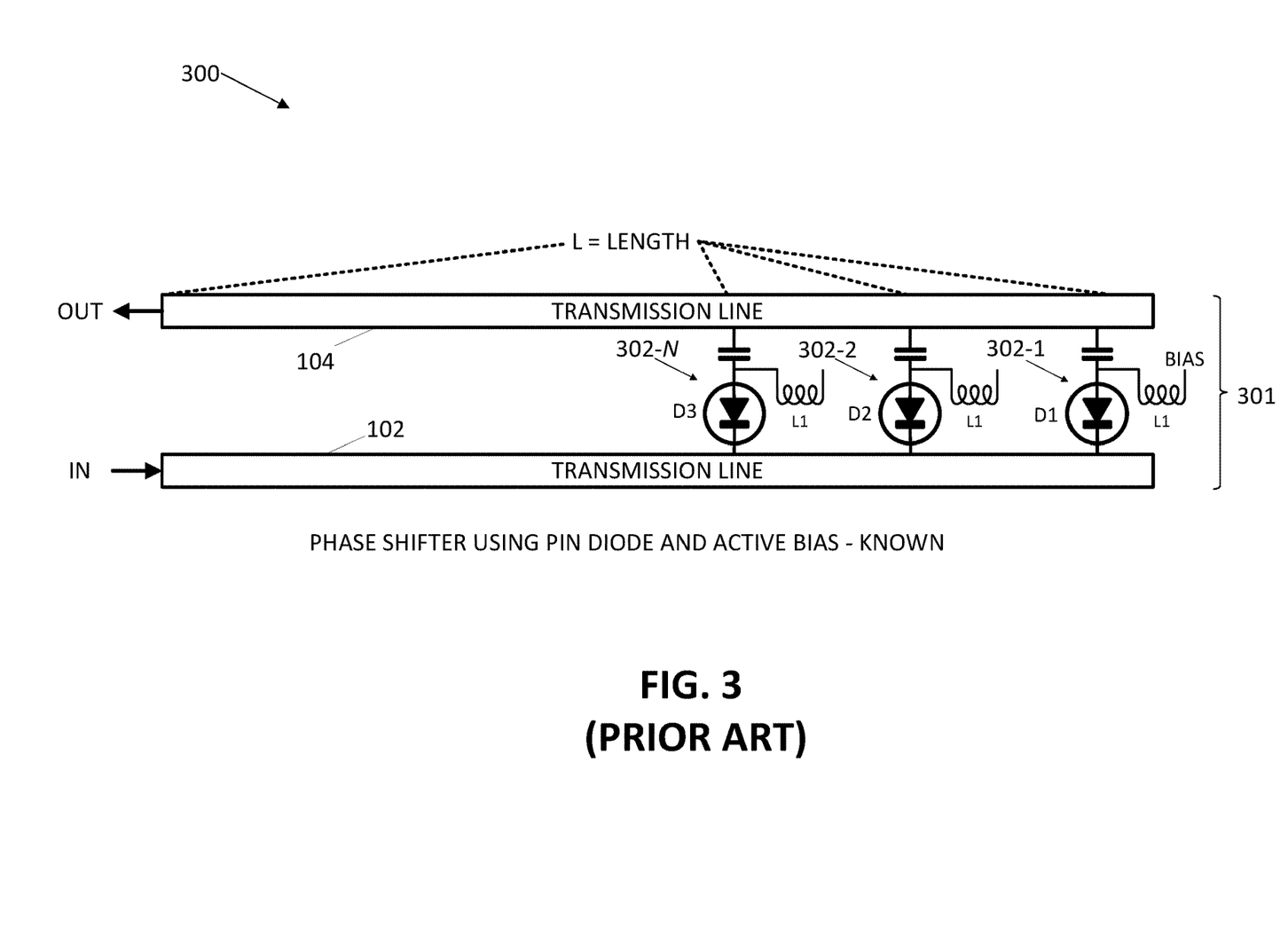
FIG. 3 depicts a schematic diagram of an example of an apparatus providing a transmission line having phase shifting capability according to a known embodiment.

FIG. 3 depicts a schematic diagram of an example of an apparatus (300) providing a transmission line (301) having phase shifting capability according to a known embodiment. Apparatus (300) includes a transmission line (301) including two non-electrically coupled conductive sections (102, 104). Apparatus (300) includes at least one electronic device (302) (e.g., PIN diode) coupled to and between the two sections (102, 104). In the example shown in FIG. 3, a plurality of electronic devices (302) is coupled to and between the two sections (102, 104) and spaced apart thereon. The at least one electronic device (302) is configured to stably maintain, in the presence of electric current applied to the at least one electronic device (302), a conductive state, and a non-conductive state, as between the two sections (102, 104) of the transmission line (301).

Figure 4:
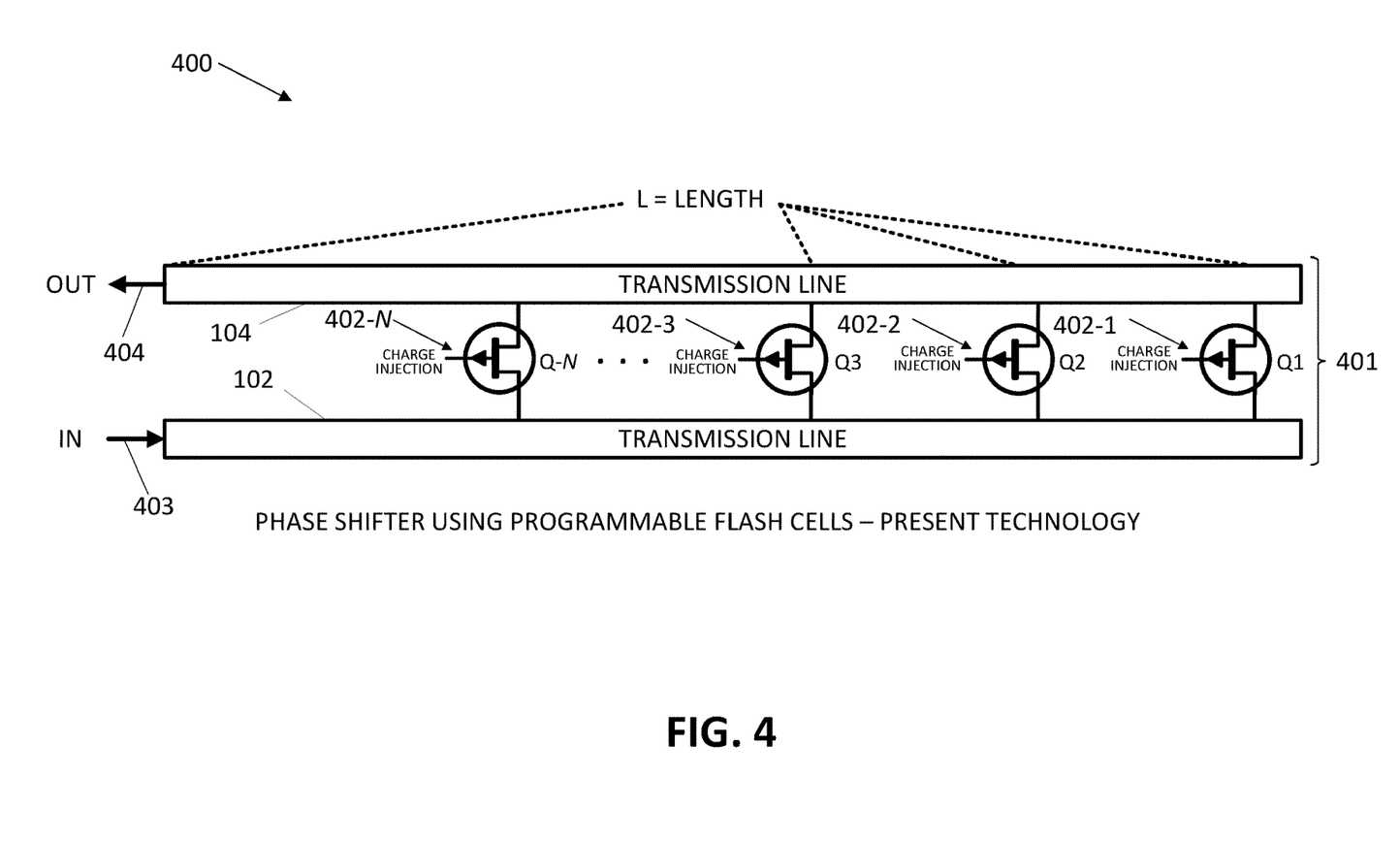
FIG. 4 depicts a schematic diagram of an apparatus according to an embodiment of the present technology.

FIG. 4 depicts a schematic diagram of an apparatus (400) according to an embodiment of the present technology. Apparatus (400) includes a transmission line (401) including two non-electrically coupled conductive sections (102, 104). In some embodiments, the two sections (102, 104) may be of equal length (L). Apparatus (400) includes at least one electronic device (402) coupled to and between the two sections (102, 104). The at least one electronic device (402) is configured to stably maintain, in the absence of electric current applied to the at least one electronic device (402), a conductive state, and a non-conductive state, as between the two sections (102, 104) of the transmission line (401). By way of a suitable controller means (described below with reference to FIG. 6), the at least one electronic device (402) may be further configured to alternate between the conductive and non-conductive states on command of a user, automatically via a control algorithm or other scheme, and/or according to a timed automated control sequence.

In an embodiment, the at least one electronic device (402) may include a floating gate (405). In one example, the floating gate (405) may be configured to enable the non-conductive state to be switched to the conductive state in response to electrons being added to the floating gate (405) of the at least one electronic device (402) in the non-conductive state. In the example, the floating gate (405) may be further configured to enable the conductive state to be switched to the non-conductive state in response to electrons being removed from the floating gate (405) of the at least one electronic device (402) in the conductive state. In another example, the floating gate (405) may be configured to enable the conductive state to be switched to the non-conductive state in response to electrons being added to the floating gate (405) of the at least one electronic device (402) conductive state. In that example, the floating gate (405) may be further configured to enable the non-conductive state to be switched to the conductive state in response to electrons being removed from the floating gate (405) of the at least one electronic device (402) in the non-conductive state.

In one embodiment of apparatus (400), the at least one electronic (402) may include a non-volatile memory (NVM) storage device. As a non-limiting example, the NVM storage device may include a floating gate (405) FET. As another non-limiting example, the NVM storage device may include a ferroelectric RAM (FRAM). As yet another non-limiting example, the NVM storage device may include a ROM cell. The ROM cell may be embodied in, or may include, Flash memory. Additionally, or alternatively, the NVM storage device may be embodied in, or may include, electrically erasable programmable ROM (EEPROM). In still another non-limiting example, the NVM storage device may include a memristor.

Figure 6:
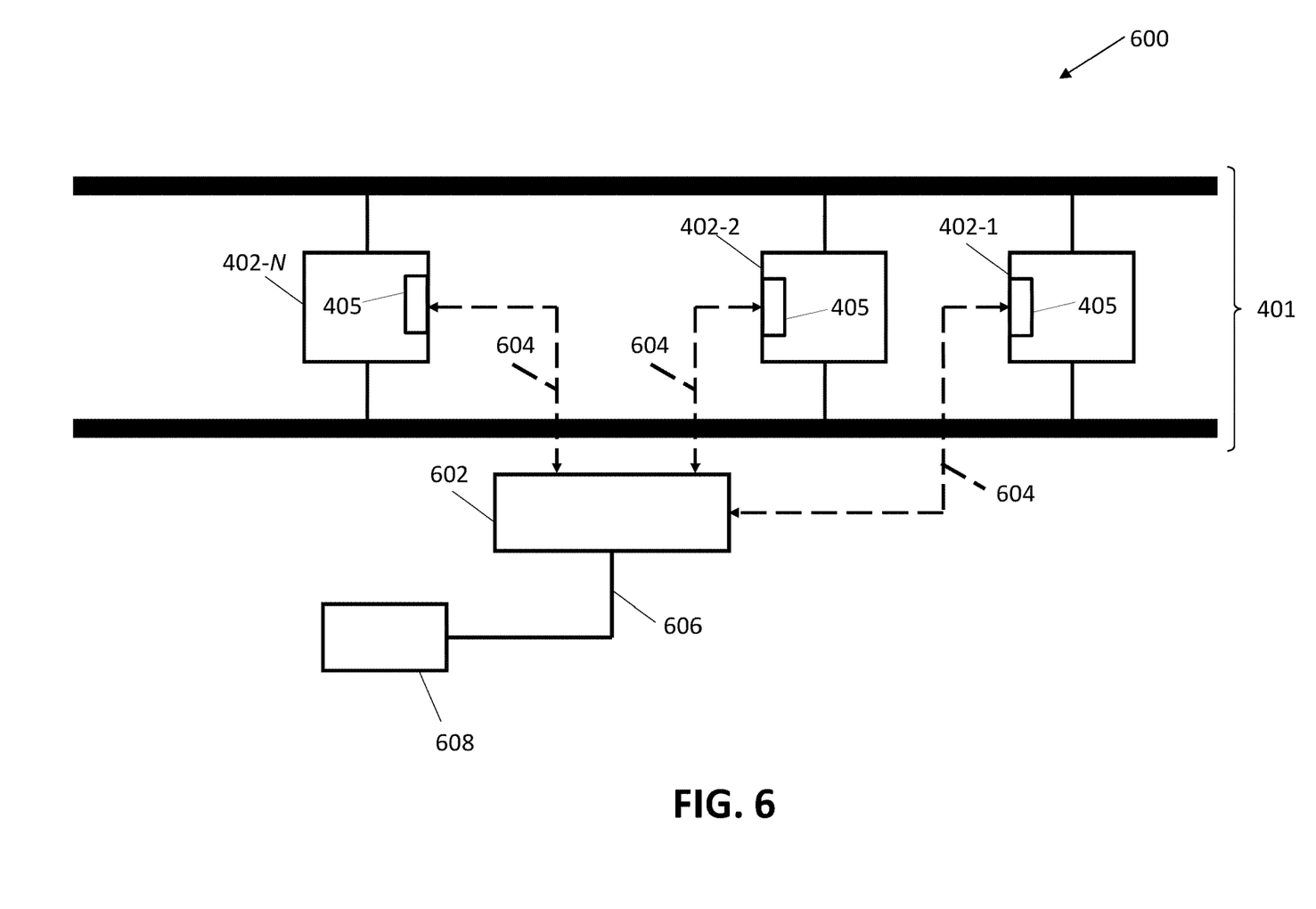
FIG. 6 depicts a schematic diagram of a system including the apparatus of FIG. 4 according to an embodiment of the present technology.

FIG. 6 depicts a schematic diagram of a system (600) according to an embodiment of the present technology. System (600) includes apparatus (400) with transmission line (401), as described above with reference to FIG. 4. Referring to FIG. 6, along with FIG. 4, system (600) includes a controller (602) operatively coupled to the at least one electronic device (402). In an example, controller (602) may be configured to transmit a control signal (604) to electronic device(s) (402) to facilitate the conductive and/or non-conductive state(s) being stably maintained. Additionally, or instead, in another example, controller (602) may be configured to withhold control signal (604) from electronic device(s) (402) to facilitate the conductive and/or non-conductive state(s) being stably maintained. In some embodiments, control signal (604) is, or includes, presence, or an absence, of a flow of electric current to the at least one electronic device (402). System (600) may also include an electric power supply (608) along with means (606) (e.g., a wired connection) for electrically coupling the controller to power supply (608).

Controller (602) may be embodied in, or may include, a variety of controller means known to persons having ordinary skill in the art. Specific, non-limiting examples of a controller (602) that may be utilized in embodiments of the present technology include microcontrollers, processors, application-specific integrated circuits (ASICs), general and/or special purpose computers, laptops, smartphones, programmable logic controllers (PLCs), field-programmable gate arrays (FPGAs), and manually or automatically operated devices like switches, buttons, and levers.

Referring still to FIGS. 4 and 6, in an embodiment, each section of the two sections (102, 104) includes a first end and a second end opposite the first end. The first end of the first section (102) may be configured to receive an input flow (403) of the electric current. The first end of the second section (104) may be configured to transmit an output flow (404) of the electric current. In some embodiments, transmission line (401) may be embodied in, may include, or may be electrically coupled to an antenna. In such embodiments, the input (403) and out (404) flows of electric current may be provided as a part of transmission and/or receipt of RF signals. Analog and/or digital electronic components for such examples of the present technology are omitted from FIGS. 4 and 6 for purposes of clarity.

In an example, the at least one electronic device (402) may be coupled to and between the two sections (102, 104) proximate to the second ends thereof. In another example, the at least one electronic device (402) includes a plurality (e.g., ≥2 or ≥3) of electronic devices (402) coupled to and between the two sections (102, 104). In this example, the plurality of electronic devices (402) may be spaced apart along portions of the lengths of the first (102) and second (104) sections of transmission line (401).

In examples having a plurality of electronic devices (402), a first electronic device (402) of the plurality of electronic devices (402) being in the conductive state may determine a first effective conductive length of the transmission line (401) when at least a second electronic device (402) of the plurality of electronic devices (402) is in the non-conductive state. In such examples, a second electronic device (402) of the plurality of electronic devices (402) being in the conductive state when at least the first electronic device (402) is in the non-conductive state may determine a second effective conductive length of the transmission line (401). The second effective conductive length may be different from the first effective conductive length.

Figure 5:
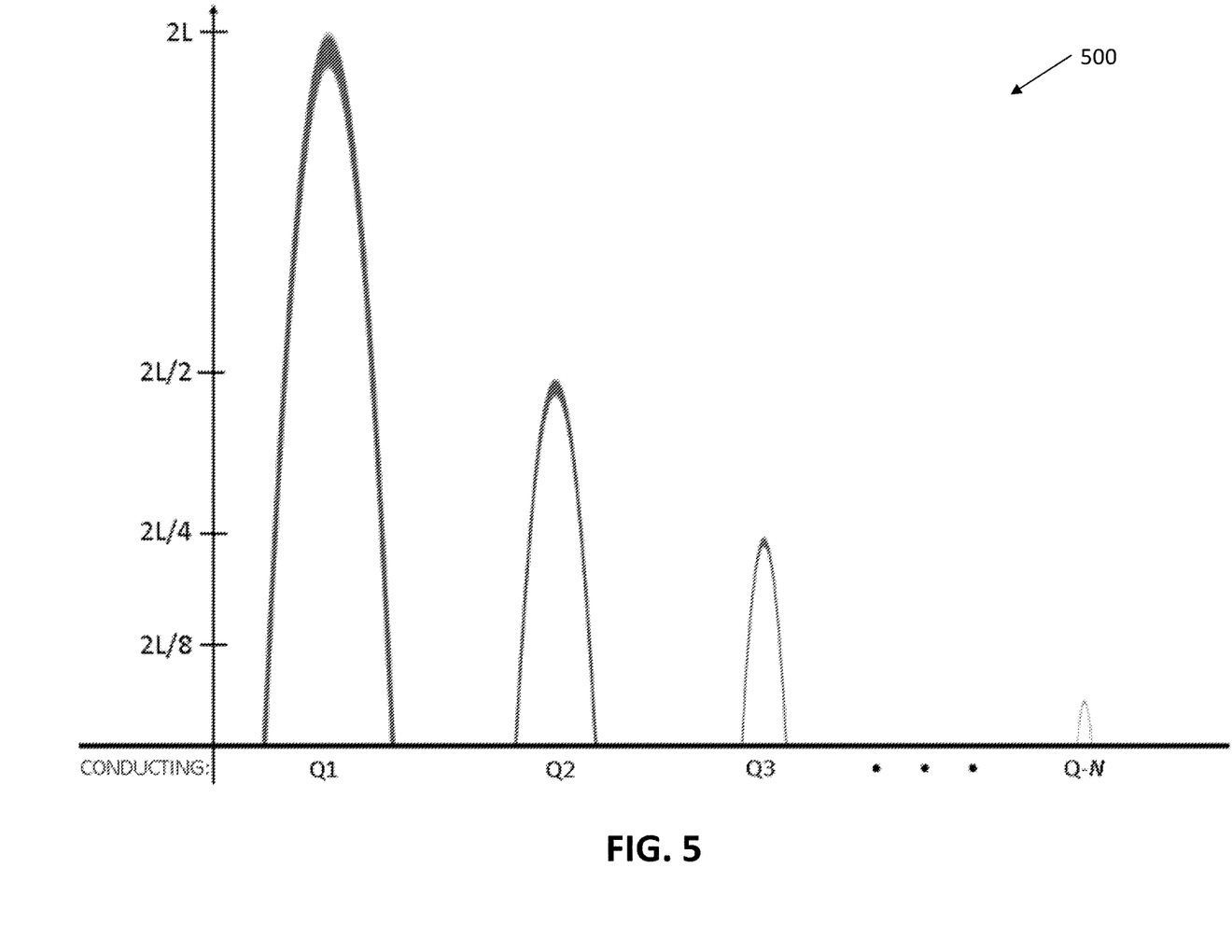
FIG. 5 depicts a plot of effective transmission line lengths by identity of transmission line electronic device in the conductive state according to an embodiment of the present technology.

The above determination of effective conductive lengths according to identity of electronic device (402) further enables effective and precise phase shifting for tapped transmission line-based antennas using comparatively less power as compared to known apparatuses, systems and methods. The techniques of the present technology are illustrated in FIG. 5, which depicts a plot 500 of effective transmission line lengths by identity of transmission line electronic device in the conductive state according to an embodiment of the present technology. As shown in plot 500, and referring also to FIG. 4, with electronic device 402-1 (denoted Q1 in FIGS. 4 and 5) coupled to and between the two sections (102, 104) proximate to the second ends thereof, the effective conductive length of transmission line 401 is, or is about (e.g., within ±10%), twice the length (2L) of each section (102, 104) when electronic device 402-1 is in the conductive state, and all other electronic device(s) (e.g., 402-2, 402-3, . . . 402-N) being in non-conductive states. Likewise, with electronic device 402-2 in coupled to and between the two sections (102, 104) at their midpoints, the conductive state, and all other electronic device(s) (e.g., 402-1, 402-3, . . . , 402-N) being in non-conductive states, the effective conductive length of transmission line 401 is, or is about, half (2L) of each section (102, 104). The phase angle of the transmission line 401 based antenna may thus be effectively changed and maintained with ease using a simple control scheme and with the only power requirement being any current applied only temporarily to the electronic device(s) 402 for purposes of changing them to and from conductive and non-conductive states.

Notably, the electronic devices (402) may be coupled to and between the two sections (102, 104) at any practical number of positions so as to enable a wide range of effective conductive lengths for transmission line (401) according to the present technology and based on the requirements and specifications for a particular application. In the case of antenna array applications, also notable is that the techniques described herein can be applied in practice such that one or more antenna array elements with transmission line (401) may have different lengths (L), numbers of devices (402), and/or coupling positions of devices (401) as compared to one or more antenna array elements. Accordingly, a wide variety of phase shift and other targets of control may be achieved using the apparatuses, systems and methods of the present technology.

For embodiments including, or adapted for use as or with, an antenna as described above, a respective one electronic device (402) of the plurality of electronic devices (402) being in the conductive state when at least one other electronic devices (402) of the plurality of electronic devices (402) is in the non-conductive state further determines a phase shift of a radio frequency signal transmitted by the antenna. Some such embodiments of system (600) may include an antenna array including a plurality of transmission lines (401). Each transmission line (401) of the plurality of transmission lines (401) may be embodied in, may include, or may be electrically coupled to, a respective antenna of a plurality of antennas of the array.

Figure 7:
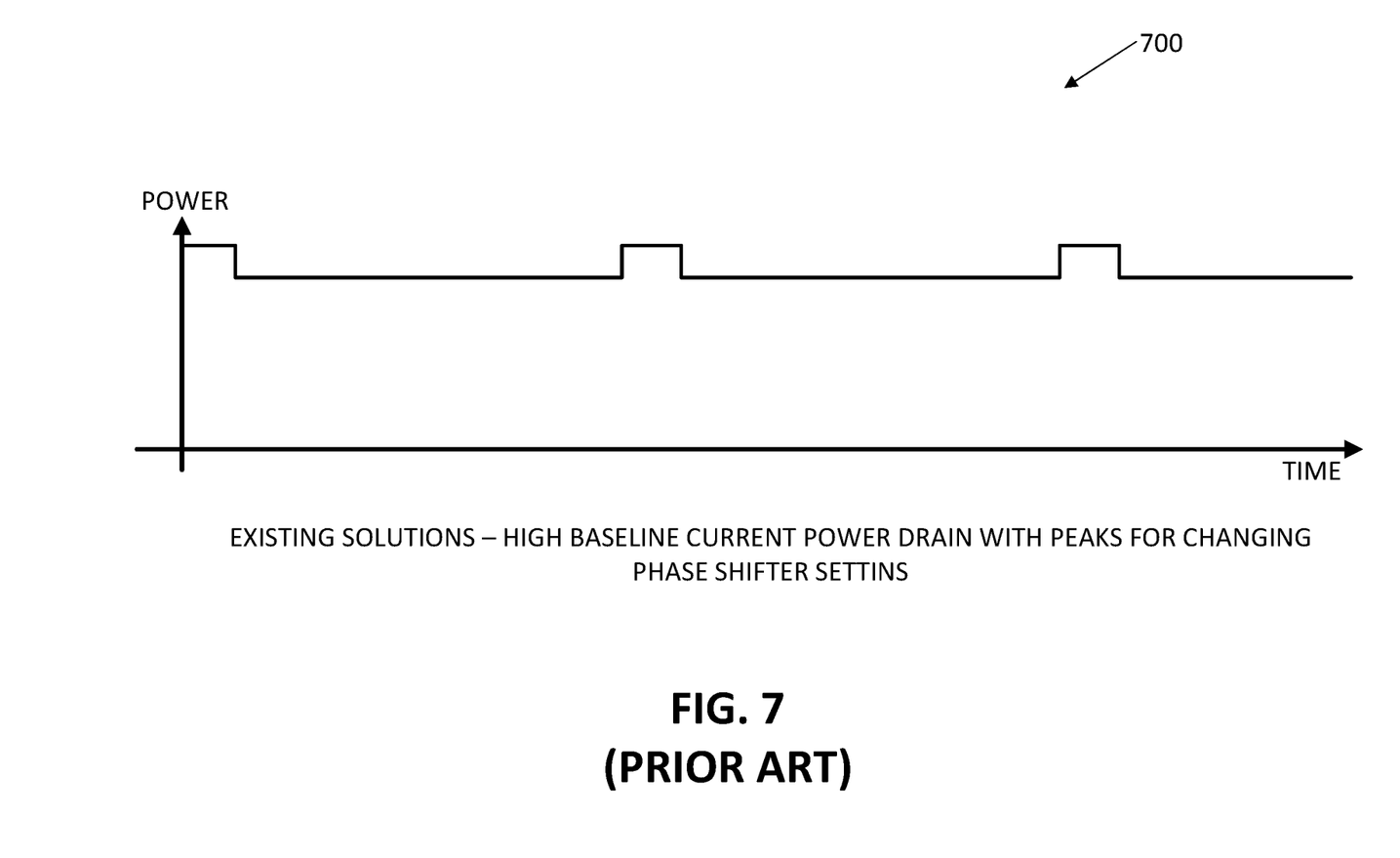
FIG. 7 depicts a plot of power consumption versus time for maintaining electronic device(s) of a tapped transmission line in the conductive state according to a known embodiment.
Figure 8:
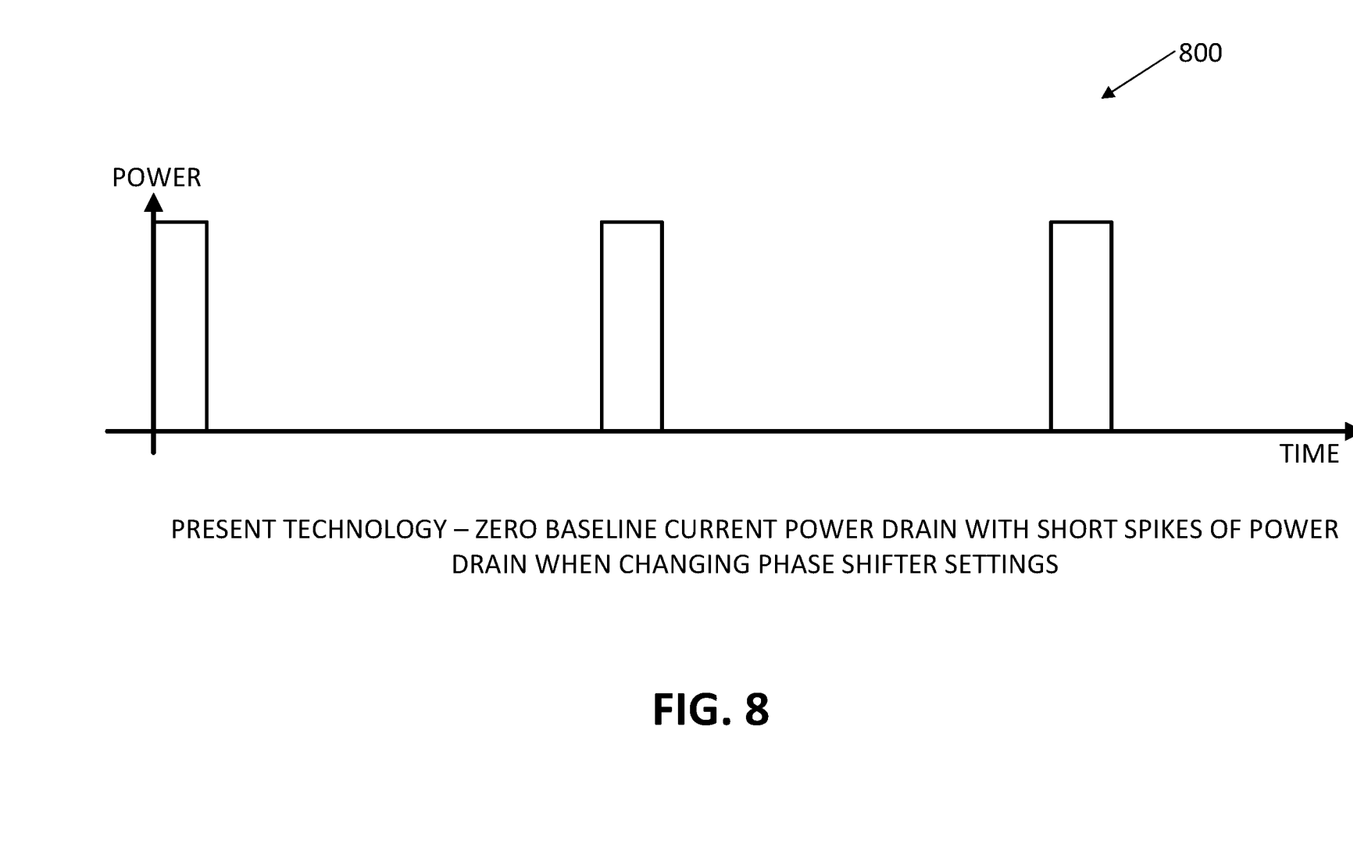
FIG. 8 depicts a plot of power consumption versus time for maintaining electronic device(s) of a tapped transmission line in the conductive state according to an embodiment of the present technology.

FIG. 7 depicts a plot (700) of power consumption versus time for maintaining electronic device(s) (e.g., 302) of a tapped transmission line (e.g., 301) in the conductive state according to a known embodiment (e.g., as shown in FIG. 3). FIG. 8 depicts a plot (800) of power consumption versus time for maintaining electronic device(s) (e.g., 402) of a tapped transmission line (e.g., 401) in the conductive state according to an embodiment of the present technology. As shown in FIG. 7, in known embodiments such as the apparatus (300) described above with reference to FIG. 3, active current is applied to device(s) 302 all the time during operation, with the spikes shown being additional current applied during state switching of those device(s) 302. By comparison, as shown in FIG. 8, in the apparatuses, systems and methods according to the present technology, active current is applied to device(s) (402) only during such times when state switching is required. Assuming the x-axes of both FIGS. 7 and 8 represents an equivalent period of time and in a similar operational application of a tapped transmission line (e.g., 301 and 401), it can be seen that the area under the curve of plot 800 is significantly less than the area under the curve of plot 700. This demonstrates that power efficiency for operation of same or similar tapped transmission lines is substantially improved using "taps" in the form of electronic device(s) (402) as compared to the known device(s) (e.g., 302).

Figure 9:
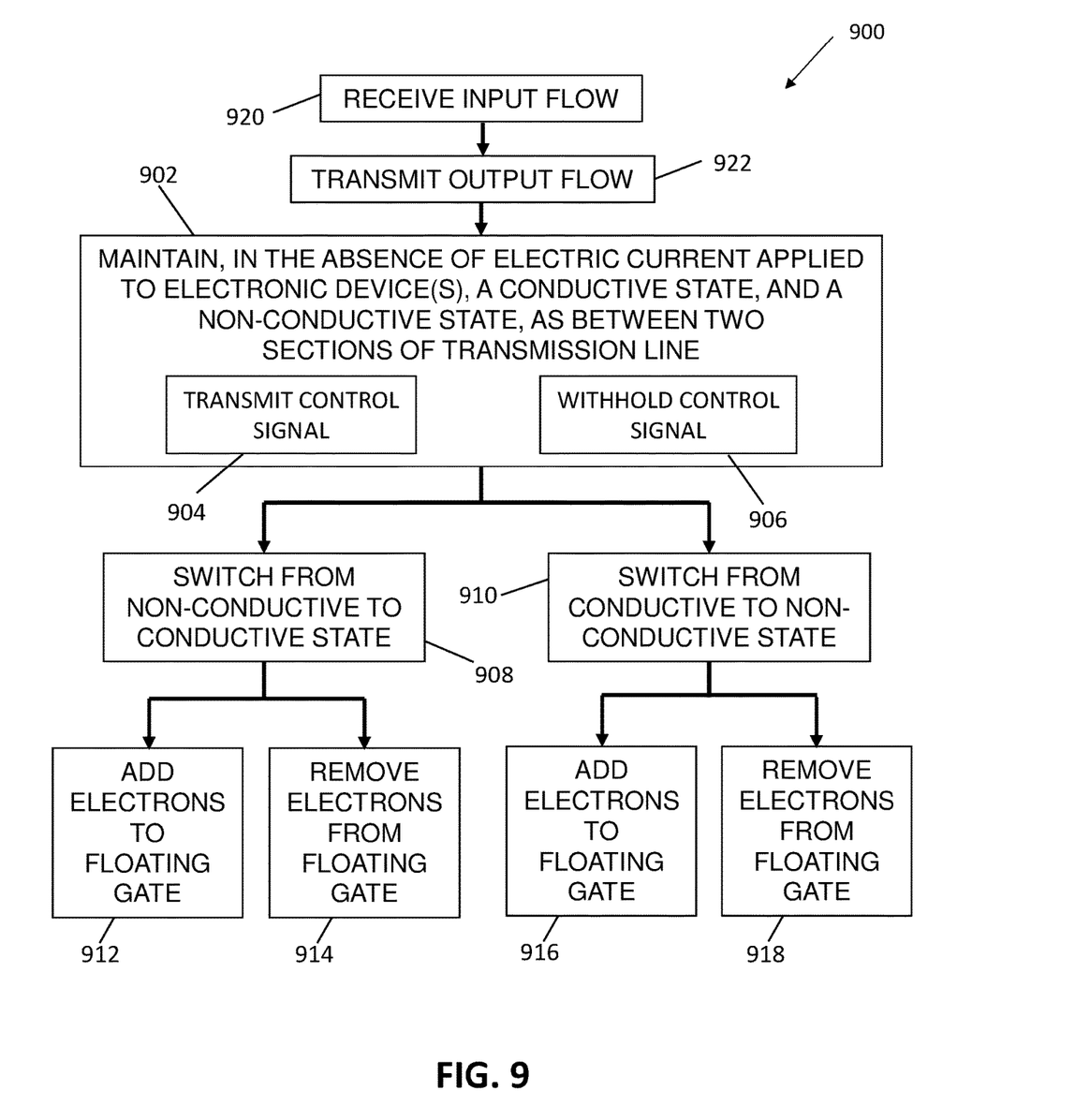
FIG. 9 depicts a flow chart of a method of operating a transmission line according to an embodiment of the present technology.

FIG. 9 depicts a flow chart of a method 900 of operating a transmission line (e.g., 401) including two non-electrically coupled conductive sections (e.g., 102 and 104) having at least one electronic device (e.g., 402) coupled to and between the two sections. Method 900 includes the step of maintaining (902), in the absence of electric current applied to the at least one electronic device, a conductive state, and a non-conductive state, as between the two sections of the transmission line. In an embodiment, the maintaining (902) step may include transmitting (904), by a controller (e.g., 604) operatively coupled to the at least one electronic device, a control signal (e.g., 604) to the electronic device(s). In another embodiment, and instead of, or in addition to, the transmitting (904) step, method (900) may include withholding (906), by the controller, the control signal from the electronic device(s).

In embodiments where the at least one electronic device includes a floating gate (405), the maintaining (902) step of method (900) may include one or both of the following steps: switching (908) the non-conductive state to the conductive state, and switching (910) the conductive state to the non-conductive state. In one example of method (900), the step of switching (908) the non-conductive state to the conductive state may include one or both of: adding (912) electrons to, and removing (914) electrons from, the floating gate (405) of the at least one electronic device in the non-conductive state. In another example of method (900), the step of switching (910) the conductive state to the non-conductive state may include one or both of: adding (916) electrons to, and removing (918) electrons from, the at least one electronic device in the conductive state.

In embodiments where each section of the two sections of the transmission line includes a first end and a second end opposite the first end, method (900) may include the step of receiving (920) an input flow (403) of the electric current at the first end of the first section (e.g., 102). In this embodiment, method (900) may also include the step of transmitting (922) an output flow (404) of the electric current from the first end of the second section (e.g., 104).

Some embodiments have the at least one electronic device coupled to and between the two sections proximate to the second ends thereof, where the at least one electronic device includes a plurality of electronic devices coupled to and between the two sections and spaced apart thereon. In such embodiments, the maintaining (902) step of method (900) may include one or both of: maintaining a first electronic device of the plurality of electronic devices in the conductive state when at least a second electronic device of the plurality of electronic devices is in the non-conductive state to determine a first effective conductive length of the transmission line, and maintaining a second electronic device of the plurality of electronic devices in the conductive state when at least the first electronic device is in the non-conductive state to determine a second effective conductive length of the transmission line. In an example, the second effective conductive length may be different from the first effective conductive length.

In various embodiments according to the present technology, method (900) may further enable a process for operating a radio frequency antenna, where the transmission line is, includes, or is electrically coupled to, an antenna. In these embodiments, the maintaining (902) of method (900) may include the step of maintaining a respective one or more of the electronic devices of the plurality of electronic devices in the conductive state when all other electronic devices of the plurality of electronic devices are in the non-conductive state to further determine a phase shift of a radio frequency signal transmitted by the antenna.

Figure 10:
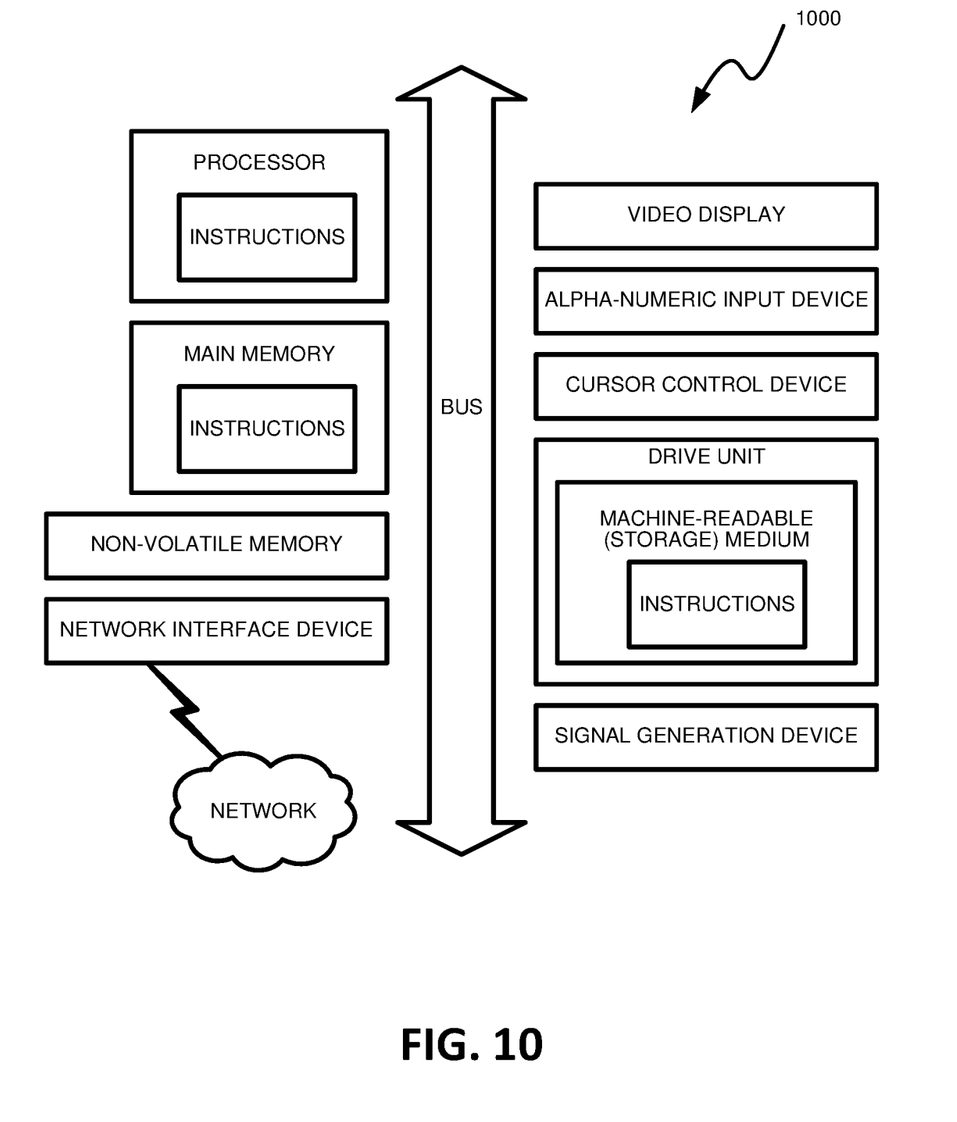
FIG. 10 depicts a diagrammatic representation of a machine, in the example form, of a computer system within which a set of instructions, for causing the machine to implement or otherwise perform any one or more of the techniques and methodologies of the present technology described herein, may be executed.

FIG. 10 depicts a diagrammatic representation of a machine, in the example form, of a computer system (1000) within which a set of instructions, for causing the machine to implement or otherwise perform any one or more of the techniques and methodologies discussed herein, may be executed. Computer system (1000) may, for some embodiments of the present technology, be representative of controller means including, without limitation, controller (602).

In the example of FIG. 10, the computer system includes a processor, memory, non-volatile memory, and an interface device. Various common components (e.g., cache memory) are omitted for illustrative simplicity. The computer system (1000) is intended to illustrate a hardware device on which any of the components depicted in the example of FIG. 6 (and any other components described in this specification) can be implemented. For example, the computer system can be any radiating object or antenna array system. The computer system can be of any applicable known or convenient type. The components of the computer system can be coupled together via a bus or through some other known or convenient device.

The processor may be, for example, a conventional microprocessor such as an INTEL PENTIUM microprocessor or MOTOROLA POWER PC microprocessor. One of skill in the relevant art will recognize that the terms "machine-readable (storage) medium" or "computer-readable (storage) medium" include any type of device that is accessible by the processor. In some embodiment, these storage media are embodied in non-transitory computer-readable media that can store program instructions (e.g., as software or firmware) which, when executed by one or more processors of the disclosed technology (e.g., system (600)), cause the controller means (e.g., controller (600)) to implement, execute, or otherwise facilitate performance of the various algorithms and methods disclosed herein.

The memory is coupled to the processor by, for example, a bus. The memory can include, by way of example but not limitation, random access memory (RAM), such as dynamic RAM (DRAM) and static RAM (SRAM). The memory can be local, remote, or distributed.

The bus also couples the processor to the non-volatile memory and drive unit. The non-volatile memory is often a magnetic floppy or hard disk, a magnetic-optical disk, an optical disk, a read-only memory (ROM), such as a CD-ROM, EPROM, or EEPROM, a magnetic or optical card, or another form of storage for large amounts of data. Some of this data is often written, by a direct memory access process, into memory during execution of software in the computer system (1000). The non-volatile storage can be local, remote, or distributed. The non-volatile memory is optional because systems can be created with all applicable data available in memory. A typical computer system will usually include at least a processor, memory, and a device (e.g., a bus) coupling the memory to the processor.

Software is typically stored in the non-volatile memory and/or the drive unit. Indeed, for large programs, it may not even be possible to store the entire program in the memory. Nevertheless, it should be understood that for software to run, if necessary, it is moved to a computer readable location appropriate for processing, and for illustrative purposes, that location is referred to as the memory in this paper. Even when software is moved to the memory for execution, the processor will typically make use of hardware registers to store values associated with the software, and local cache that, ideally, serves to speed up execution. As used herein, a software program is assumed to be stored at any known or convenient location (from non-volatile storage to hardware registers) when the software program is referred to as "implemented in a computer-readable medium". A processor is considered to be "configured to execute a program" when at least one value associated with the program is stored in a register readable by the processor.

The bus also couples the processor to the network interface device. The interface can include one or more of a modem or network interface. It will be appreciated that a modem or network interface can be considered to be part of the computer system. The interface can include an analog modem, ISDN modem, cable modem, token ring interface, satellite transmission interface (e.g., "direct PC"), or other interfaces for coupling a computer system to other computer systems. The interface can include one or more input and/or output (I/O) devices. The I/O devices can include, by way of example but not limitation, a keyboard, a mouse or other pointing device, disk drives, printers, a scanner, and other input and/or output devices, including a display device. The display device can include, by way of example but not limitation, a cathode ray tube (CRT), liquid crystal display (LCD), or some other applicable known or convenient display device. For simplicity, it is assumed that controllers of any devices not depicted in the example of FIG. 10 reside in the interface.

In operation, the computer system (1000) can be controlled by operating system software that includes a file management system, such as a disk operating system. One example of operating system software with associated file management system software is the family of operating systems known as WINDOWS from MICROSOFT Corporation of Redmond, Washington, and their associated file management systems. Another example of operating system software with its associated file management system software is the LINUX operating system and its associated file management system. The file management system is typically stored in the non-volatile memory and/or drive unit and causes the processor to execute the various acts required by the operating system to input and output data and to store data in the memory, including storing files on the non-volatile memory and/or drive unit.

Some portions of the detailed description may be presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The algorithms and displays presented herein are not inherently related to any particular computer or other apparatus. Various general-purpose systems may be used with programs in accordance with the teachings herein, or it may prove convenient to construct more specialized apparatus to perform the methods of some embodiments. The required structure for a variety of these systems will appear from the description below. In addition, the techniques are not described with reference to any particular programming language, and various embodiments may thus be implemented using a variety of programming languages.

In alternative embodiments, the machine operates as a standalone device or may be connected (e.g., networked) to other machines. In a networked deployment, the machine may operate in the capacity of a server or a client machine in a client-server network environment or as a peer machine in a peer-to-peer (or distributed) network environment.

The machine may be a server computer, a client computer, a personal computer (PC), a tablet PC, a laptop computer, a set-top box (STB), a personal digital assistant (PDA), a cellular telephone, an IPHONE, a BLACKBERRY, a processor, a telephone, a web appliance, a network router, switch or bridge, or any machine capable of executing a set of instructions (sequential or otherwise) that specify actions to be taken by that machine.

While the machine-readable medium or machine-readable storage medium is shown in an exemplary embodiment to be a single medium, the term "machine-readable medium" and "machine-readable storage medium" should be taken to include a single medium or multiple media (e.g., a centralized or distributed database, and/or associated caches and servers) that store the one or more sets of instructions. The term "machine-readable medium" and "machine-readable storage medium" shall also be taken to include any medium that is capable of storing, encoding or carrying a set of instructions for execution by the machine and that cause the machine to perform any one or more of the methodologies of the presently disclosed technique and innovation.

In general, the routines executed to implement the embodiments of the disclosure, may be implemented as part of an operating system or a specific application, component, program, object, module or sequence of instructions referred to as "computer programs." The computer programs typically comprise one or more instructions set at various times in various memory and storage devices in a computer, and that, when read and executed by one or more processing units or processors in a computer, cause the computer to perform operations to execute elements involving the various aspects of the disclosure.

Moreover, while embodiments have been described in the context of fully functioning computers and computer systems, those skilled in the art will appreciate that the various embodiments are capable of being distributed as a program product in a variety of forms, and that the disclosure applies equally regardless of the particular type of machine or computer-readable media used to actually effect the distribution.

Further examples of machine-readable storage media, machine-readable media, or computer-readable (storage) media include but are not limited to recordable type media such as volatile and non-volatile memory devices, floppy and other removable disks, hard disk drives, optical disks (e.g., Compact Disk Read-Only Memory (CD ROMS), Digital Versatile Disks, (DVDs), etc.), among others, and transmission type media such as digital and analog communication links.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof, means any connection or coupling, either direct or indirect, between two or more elements; the coupling of connection between the elements can be physical, logical, or a combination thereof. Additionally, the words "herein," "above," "below," and words of similar import, when used in this application, shall refer to this application as a whole and not to any particular portions of this application. Where the context permits, words in the above detailed description using the singular or plural number may also include the plural or singular number, respectively. The word "or," in reference to a list of two or more items, covers all of the following interpretations of the word: any of the items in the list, all of the items in the list, and any combination of the items in the list.

The above detailed description of embodiments of the disclosure is not intended to be exhaustive or to limit the teachings to the precise form disclosed above. While specific embodiments of, and examples for, the disclosure are described above for illustrative purposes, various equivalent modifications are possible within the scope of the disclosure, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are, at times, shown as being performed in a series, these processes or blocks may instead be performed in parallel, or may be performed at different times. Further, any specific numbers noted herein are only examples: alternative implementations may employ differing values or ranges.

The teachings of the disclosure provided herein can be applied to other systems, not necessarily the system described above. The elements and acts of the various embodiments described above can be combined to provide further embodiments.

Any patents and applications and other references noted above, including any that may be listed in accompanying filing papers, are incorporated herein by reference. Aspects of the disclosure can be modified, if necessary, to employ the systems, functions, and concepts of the various references described above to provide yet further embodiments of the disclosure.

These and other changes can be made to the disclosure in light of the above detailed description. While the above description describes certain embodiments of the disclosure, and describes the best mode contemplated, no matter how detailed the above appears in text, the teachings can be practiced in many ways. Details of the system may vary considerably in its implementation details, while still being encompassed by the subject matter disclosed herein. As noted above, particular terminology used when describing certain features or aspects of the disclosure should not be taken to imply that the terminology is being redefined herein to be restricted to any specific characteristics, features, or aspects of the disclosure with which that terminology is associated. In general, the terms used in the following claims should not be construed to limit the disclosure to the specific embodiments disclosed in the specification, unless the above detailed description section explicitly defines such terms. Accordingly, the actual scope of the disclosure encompasses not only the disclosed embodiments, but also all equivalent ways of practicing or implementing the disclosure under the claims.

While certain aspects of the disclosure are presented below in certain claim forms, the inventors contemplate the various aspects of the disclosure in any number of claim forms. For example, while only one aspect of the disclosure is recited as a means-plus-function claim under 35 U.S.C. § 112 (f), other aspects may likewise be embodied as a means-plus-function claim, or in other forms, such as being embodied in a computer-readable medium. (Any claims intended to be treated under 35 U.S.C. § 112(f) will begin with the words "means for".) Accordingly, the applicant reserves the right to add additional claims after filing the application to pursue such additional claim forms for other aspects of the disclosure.

The detailed description provided herein may be applied to other systems, not necessarily only the system described above. The elements and acts of the various examples described above can be combined to provide further implementations of the invention. Some alternative implementations of the invention may include not only additional elements to those implementations noted above, but also may include fewer elements. These and other changes can be made to the invention in light of the above detailed description. While the above description defines certain examples of the invention, and describes the best mode contemplated, no matter how detailed the above appears in text, the invention can be practiced in many ways. Details of the system may vary considerably in its specific implementation, while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific examples disclosed in the specification, unless the above detailed description section explicitly defines such terms. Accordingly, the actual scope of the invention encompasses not only the disclosed examples, but also all equivalent ways of practicing or implementing the invention.

What is claimed is:

1. An apparatus comprising:
   a plurality of transmission lines, wherein each transmission line of the plurality of transmission lines includes two non-electrically coupled conductive sections, and wherein each transmission line of the plurality of transmission lines is, includes, or is electrically coupled to, an antenna to thereby form an antenna array having a plurality of antennas; and
   at least one electronic device coupled to and between the two non-electrically coupled conductive sections of each transmission line of the plurality of transmission lines, and configured to stably maintain, in the absence of electric current applied to the at least one electronic device, a conductive state, and a non-conductive state, as between the two non-electrically coupled conductive sections of each transmission line of the plurality of transmission lines.

2. The apparatus of claim 1, wherein the at least one electronic device includes a floating gate configured to:
   enable the non-conductive state to be switched to the conductive state in response to electrons being added to the floating gate of the at least one electronic device in the non-conductive state; and
   enable the conductive state to be switched to the non-conductive state in response to electrons being removed from the floating gate of the at least one electronic device in the conductive state;
   or
   enable the conductive state to be switched to the non-conductive state in response to electrons being added to the floating gate of the at least one electronic device conductive state; and
   enable the non-conductive state to be switched to the conductive state in response to electrons being removed from the floating gate of the floating gate of the at least one electronic device in the non-conductive state.

3. The apparatus of claim 1, wherein the at least one electronic includes a non-volatile memory (NVM) storage device.

4. The apparatus of claim 3, wherein the NVM storage device includes a floating gate field effect transistor (FET), a ferroelectric RAM (FRAM), a read-only memory (ROM) cell, Flash memory, or electrically erasable programmable ROM (EEPROM).

5. The apparatus of claim 1, wherein the two non-electrically coupled conductive sections are of equal length (L).

6. The apparatus of claim 1, wherein each section of the two non-electrically coupled conductive sections includes a first end and a second end opposite the first end, the first end of the first section configured to receive an input flow of the electric current, and the first end of the second section configured to transmit an output flow of the electric current.

7. The apparatus of claim 6, wherein the at least one electronic device is coupled to and between the two non-electrically coupled conductive sections proximate to the second ends thereof.

8. The apparatus of claim 1, wherein the at least one electronic device includes a plurality of electronic devices coupled to and between the two non-electrically coupled conductive sections.

9. The apparatus of claim 1, wherein the at least one electronic device includes a memristor.

10. A system comprising:
a transmission line including two non-electrically coupled conductive sections;
at least one electronic device coupled to and between the two non-electrically coupled conductive sections, and configured to stably maintain, in the absence of electric current applied to the at least one electronic device, a conductive state, and a non-conductive state, as between the two non-electrically coupled conductive sections of the transmission line, wherein the at least one electronic device includes a memristor; and
a controller operatively coupled to the at least one electronic device, and configured to at least one of: transmit, and withhold, a control signal to or from the at least one electronic device to enable the conductive, and non-conductive, states to be stably maintained.

11. The system of claim 10, wherein the transmission line includes a plurality of transmission lines, and wherein each transmission line of the plurality of transmission lines is, includes, or is electrically coupled to, an antenna to thereby form an antenna array having a plurality of antennas.

12. The system of claim 10, wherein the control signal includes a presence, or an absence, of a flow of electric current to the at least one electronic device.

13. The system of claim 10, wherein the at least one electronic device includes a plurality of electronic devices coupled to and between the two non-electrically coupled conductive sections and spaced apart thereon.

14. The system of claim 13, wherein the transmission line is, includes, or is electrically coupled to, an antenna, and wherein a respective one electronic device of the plurality of electronic devices being in the conductive state when at least one other electronic devices of the plurality of electronic devices is in the non-conductive state further determines a phase shift of a radio frequency signal transmitted by the antenna.

15. The system of claim 13, wherein a first electronic device of the plurality of electronic devices being in the conductive state determines a first effective conductive length of the transmission line when at least a second electronic device of the plurality of electronic devices is in the non-conductive state, and wherein a second electronic device of the plurality of electronic devices being in the conductive state when at least the first electronic device is in the non-conductive state determines a second effective conductive length of the transmission line, the second effective conductive length different from the first effective conductive length.

16. The system of claim 13, wherein the plurality of electronic devices includes three or more electronic devices.

17. The system of claim 10, wherein the at least one electronic includes a non-volatile memory (NVM) storage device.

18. The system of claim 17, wherein the NVM storage device includes a floating gate field effect transistor (FET), a ferroelectric RAM (FRAM), a read-only memory (ROM) cell, Flash memory, or electrically erasable programmable ROM (EEPROM).

19. A method of operating a transmission line including two non-electrically coupled conductive sections having at least one electronic device coupled to and between the two sections, the method comprising maintaining, in the absence of electric current applied to the at least one electronic device, a conductive state, and a non-conductive state, as between the two non-electrically coupled conductive sections of the transmission line, wherein the at least one electronic device includes a plurality of electronic devices, and wherein the maintaining step comprises:
maintaining a first electronic device of the plurality of electronic devices in the conductive state when at least a second electronic device of the plurality of electronic devices is in the non-conductive state to determine a first effective conductive length of the transmission line; or
maintaining a second electronic device of the plurality of electronic devices in the conductive state when at least the first electronic device is in the non-conductive state to determine a second effective conductive length of the transmission line, the second effective conductive length different from the first effective conductive length.

20. The method of claim 19, wherein the maintaining step comprises at least one of: transmitting, and withholding, a control signal to or from the at least one electronic device.

* * * * *